(12) United States Patent
Chen et al.

(10) Patent No.: US 11,022,878 B2
(45) Date of Patent: *Jun. 1, 2021

(54) CRITICAL DIMENSION UNIFORMITY

(71) Applicant: Taiwan Semiconductor Manufacturing Co., Ltd., Hsinchu (TW)

(72) Inventors: Xi-Zong Chen, Tainan (TW); Cha-Hsin Chao, Taipei (TW); Yi-Wei Chiu, Kaohsiung (TW); Li-Te Hsu, Tainan (TW); Chih-Hsuan Lin, Tainan (TW)

(73) Assignee: Taiwan Semiconductor Manufacturing Co.. Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/657,551

(22) Filed: Oct. 18, 2019

(65) Prior Publication Data
US 2020/0050103 A1 Feb. 13, 2020

Related U.S. Application Data

(63) Continuation of application No. 16/100,742, filed on Aug. 10, 2018, now Pat. No. 10,495,970.

(60) Provisional application No. 62/586,300, filed on Nov. 15, 2017.

(51) Int. Cl.
| | | |
|---|---|---|
| H01L 21/033 | (2006.01) | |
| G03F 7/004 | (2006.01) | |
| G03F 7/20 | (2006.01) | |
| H01L 21/02 | (2006.01) | |

(Continued)

(52) U.S. Cl.
CPC ........ G03F 7/0041 (2013.01); G03F 7/70691 (2013.01); H01L 21/0273 (2013.01); H01L 21/02115 (2013.01); H01L 21/02164 (2013.01); H01L 21/02211 (2013.01); H01L 21/02263 (2013.01); H01L 21/02271 (2013.01); H01L 21/02274 (2013.01); H01L 21/02288 (2013.01);

(Continued)

(58) Field of Classification Search
CPC .......... H01L 21/02115; H01L 21/0337; H01L 21/02263; H01L 21/02271; H01L 21/0273; H01L 21/31105; H01L 21/30655; G03F 7/0041
USPC .................................. 216/16, 17, 47, 49, 80
See application file for complete search history.

(56) References Cited

U.S. PATENT DOCUMENTS

| 10,495,970 B2 * | 12/2019 | Chen ................. H01L 21/02164 |
| 2009/0162790 A1 | 6/2009 | Romano et al. |
| 2009/0163035 A1 | 6/2009 | Romano et al. |

(Continued)

Primary Examiner — Binh X Tran
(74) Attorney, Agent, or Firm — Sterne, Kessler, Goldstein & Fox P.L.L.C.

(57) ABSTRACT

The present disclosure describes a method for improving post-photolithography critical dimension (CD) uniformity for features printed on a photoresist. A layer can be formed on one or more printed features and subsequently etched to improve overall CD uniformity across the features. For example the method includes a material layer disposed over a substrate and a photoresist over the material layer. The photoresist is patterned to form a first feature with a first critical dimension (CD) and a second feature with a second CD that is larger than the first CD. Further, a layer is formed with one or more deposition/etch cycles in the second feature to form a modified second CD that is nominally equal to the first CD.

20 Claims, 11 Drawing Sheets

(51) Int. Cl.
*H01L 21/311* (2006.01)
*H01L 21/027* (2006.01)
(52) U.S. Cl.
CPC .... *H01L 21/0337* (2013.01); *H01L 21/31105* (2013.01); *H01L 21/31122* (2013.01)

(56) References Cited

U.S. PATENT DOCUMENTS

| | | | | |
|---|---|---|---|---|
| 2011/0244686 | A1* | 10/2011 | Aso | H01L 21/30655 |
| | | | | 438/694 |
| 2012/0322011 | A1* | 12/2012 | Wu | G03F 7/36 |
| | | | | 430/432 |
| 2014/0038412 | A1 | 2/2014 | Hu et al. | |
| 2015/0200109 | A1 | 7/2015 | Kong et al. | |
| 2016/0268141 | A1 | 9/2016 | Hudson | |
| 2016/0314981 | A1* | 10/2016 | Yoon | H01L 21/32139 |
| 2018/0286707 | A1* | 10/2018 | Hudson | H01J 37/32422 |

* cited by examiner

CRITICAL DIMENSION UNIFORMITY

CROSS-REFERENCE TO RELATED APPLICATION

This application is a continuation of U.S. Non-Provisional patent application Ser. No. 16/100,742, filed on Aug. 10, 2018 and titled "Critical Dimension Uniformity," which claims the benefit of U.S. Provisional Patent Application No. 62/586,300, filed on Nov. 15, 2017 and titled "Critical Dimension Uniformity." The entire contents of both applications are incorporated by reference herein in their entireties.

BACKGROUND

In a photolithography operation, a pattern from a reticle is transferred to a photoresist on a wafer. The transferred pattern may include geometrical features, such as lines with different widths, openings of different shapes and sizes (e.g., circular, elliptical, rectangular, etc.), and the like. The dimensions of each feature may be described in terms of its critical dimension (CD). For example, referring to a circular-shaped opening, a CD can refer to a width of the opening.

BRIEF DESCRIPTION OF THE DRAWINGS

Aspects of the present disclosure are best understood from the following detailed description when read with the accompanying figures. It is noted that, in accordance with common practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed that are between the first and second features, such that the first and second features are not in direct contact. In addition, the present disclosure may repeat reference numerals and/or letters in the various examples.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "nominal" as used herein refers to a desired, or target, value of a characteristic or parameter for a component or a process operation, set during the design phase of a product or a process, together with a range of values above and/or below the desired value. The range of values can be due to variations in manufacturing processes or tolerances.

The term "about" as used herein indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

In a photolithography operation, a pattern from a reticle is transferred to an area of a photoresist on a wafer. The transferred pattern may include geometrical features, such as lines with different widths, openings of different shapes and sizes (e.g., circular, elliptical, rectangular, etc.), and the like. The dimensions of each feature may be described in terms of its critical dimension (CD). For example, a CD can correspond to one or more dimensions of the feature. For example, referring to a circular-shaped opening, a CD can refer to the opening's width. And, in referring to a line, the CD can refer to the line's width.

On the reticle pattern, groups of features of nominally equal size (e.g., nominally equal CD), when transferred to the photoresist on the wafer, are expected to be "printed" (e.g., transferred) as features having nominally equal size. In other words, for groups of nominally equal-sized features, the CD non-uniformity across the printed area of the photoresist should be zero. However, process variability can cause CD non-uniformities. Post-photolithography CD measurements (e.g., after develop inspection (API) CD measurements) can reveal the degree of CD non-uniformity for groups of features within a printed area of the photoresist and/or across the wafer.

CD non-uniformity can be exacerbated after an etch operation due to factors, such as etch process non-uniformities and etch loading effects (e.g., etch rate dependency on feature density and feature location on a die or feature location on the wafer). After the photoresist is developed, if the CD non-uniformity is not within a design tolerance or limit, the wafer can be reworked—e.g., the photoresist can be stripped, and the photolithography process can be repeated with different depth of focus conditions. However, acceptable CD uniformity may not be achieved after photolithography operations due to layer thickness non-uniformity across the wafer or other limitations that may, or may not, be related to the photolithography process.

This disclosure is directed to a method that uses a layer to improve post-photolithography CD uniformity for features printed on a photoresist. In some embodiments, the layer is deposited using one or more deposition-etch cycles. In some embodiments, the layer is a carbon film deposited with a plasma process that uses tetrafluoromethane ($CF_4$) or fluoroform ($CHF_3$) with a hydrogen/nitrogen mixture. The carbon film can be etched with a low frequency (LF) and low power (LP) plasma process that uses an oxygen and nitrogen gas mixture. In some embodiments, the layer is a dielectric film (e.g., silicon oxide) deposited with a high pressure chemical vapor deposition (HPCVD) process using silane ($SiH_4$) and oxygen. The dielectric film can be etched with an argon ion ($Ar^+$) sputtering process.

Figure 1:
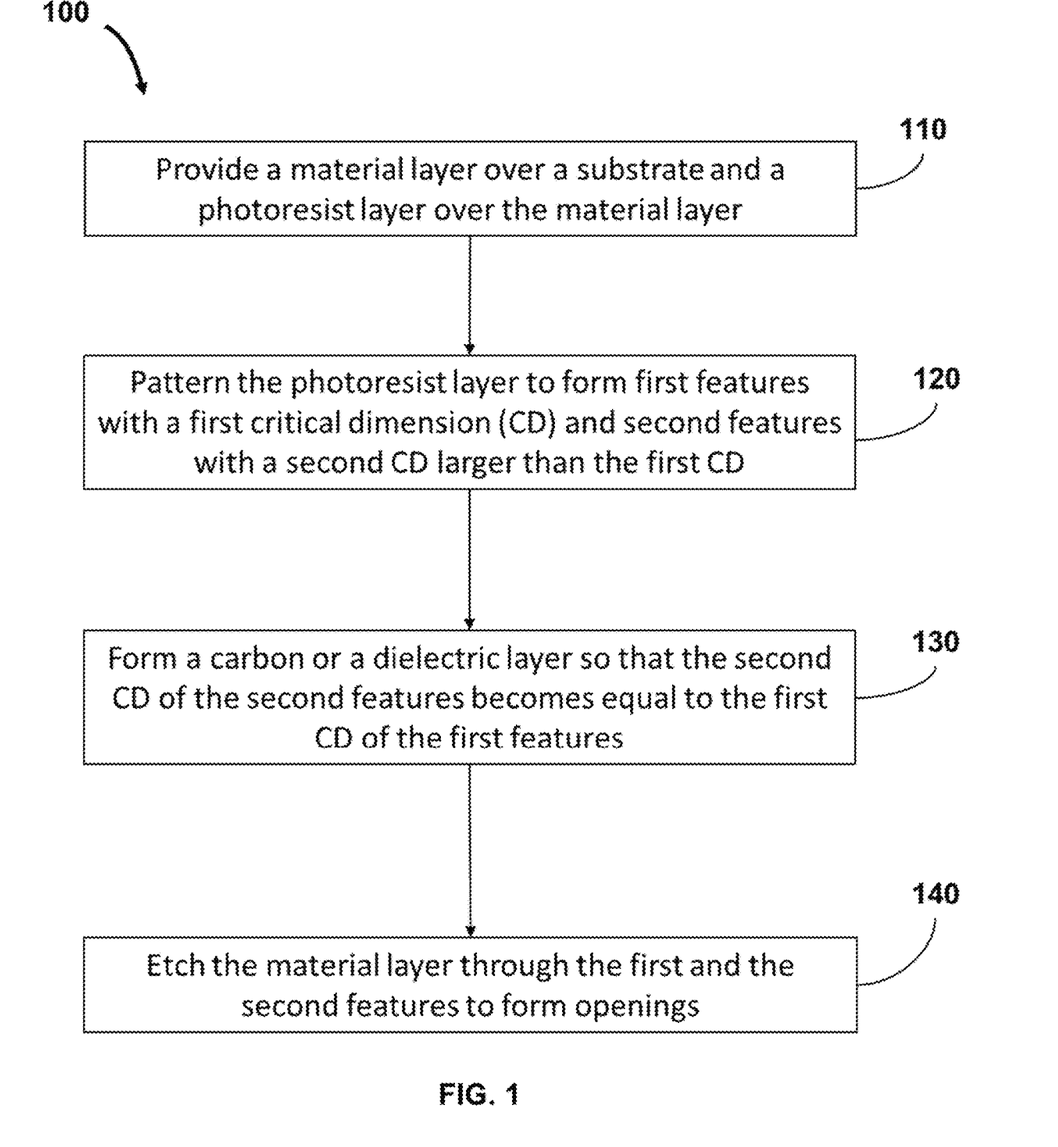
FIG. 1 is a flowchart of a method for improving critical dimension uniformity of printed features on a photoresist, according to some embodiments.

FIG. 1 is a flowchart of a method 100 for improving post-photolithography CD uniformity for features patterned on a photoresist layer, according to some embodiments. This disclosure is not limited to this operational description. Rather, other operations are within the spirit and scope of the present disclosure. It is to be appreciated that additional operations may be performed. Moreover, not all operations may be needed to perform the disclosure provided herein. Further, some of the operations may be performed simultaneously, or in a different order than shown in FIG. 1. In some implementations, one or more other operations may be performed in addition to or in place of the presently described operations. For illustrative purposes, method 100 is described with reference to the embodiments shown in FIGS. 2-10. However, method 100 is not limited to these embodiments.

Figure 2:
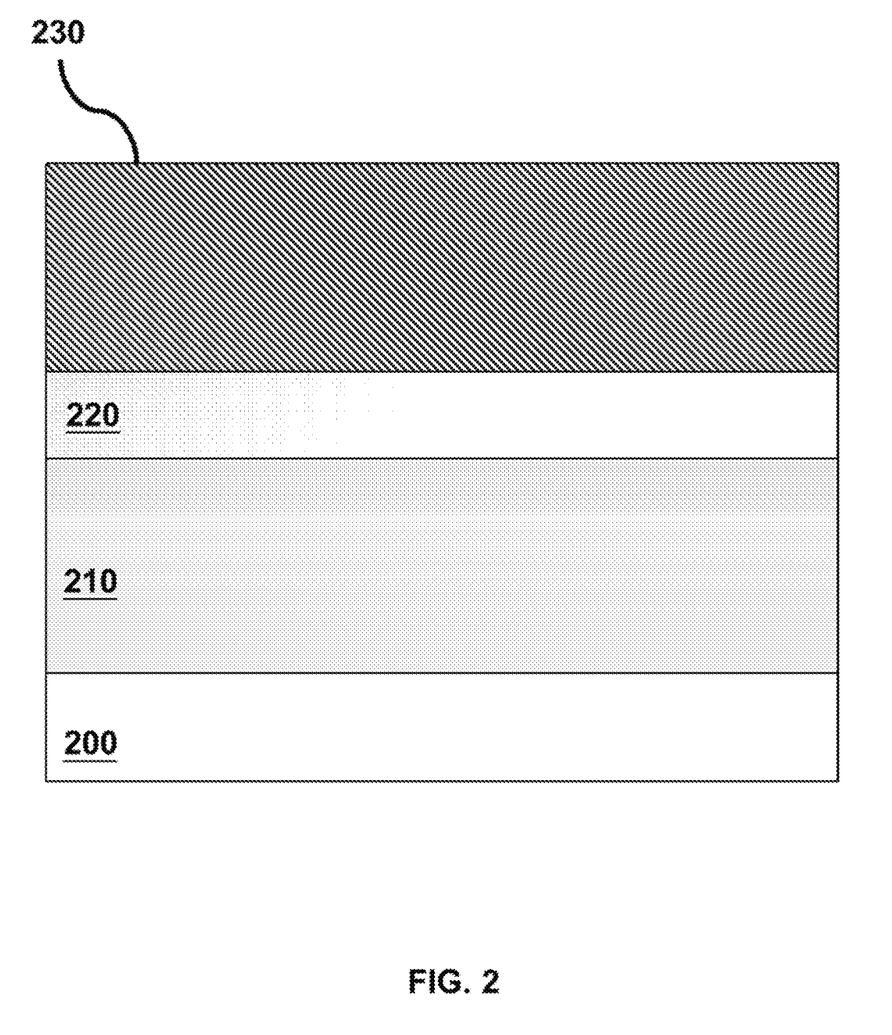
FIG. 2 is a cross-sectional view of a photoresist tri-layer, according to some embodiments.

In referring to FIGS. 1 and 2, method 100 starts with operation 110, where a material layer 210 is provided over a substrate 200, and a photoresist layer 230 is provided on a bottom antireflective coating (BARC) layer 220 over material layer 210. In some embodiments, substrate 200 is a bare semiconductor bulk wafer, a bare semiconductor bulk wafer with fins thereon, a top layer of a semiconductor on insulator (SOI) wafer, a top layer of a semiconductor on insulator (SOI) wafer with fins thereon, or a partially (or fully) fabricated semiconductor wafer that includes previously—formed layers—such as front-end of the line (FEOL), middle of the line (MOL), and/or back-end of the line (BEOL) layers. In some embodiments, substrate 200 is made of silicon (Si) or another elementary semiconductor such as, for example, (i) germanium (Ge); (ii) a compound semiconductor including silicon germanium (SiGe), silicon carbide (SiC), gallium arsenide (GaAs), gallium phosphide (GaP), indium phosphide (InP), indium arsenide (InAs), and/or indium antimonide (InSb); (iii) an alloy semiconductor including silicon germanium (SiGe), gallium arsenide phosphide (GaAsP), aluminum indium arsenide (AlInAs), aluminum gallium arsenide (AlGaAs), gallium indium arsenide (GaInAs), gallium indium phosphide (GaInP), and/or gallium indium arsenide phosphide (GaInAsP); or (iv) combinations thereof.

In some embodiments, material layer 210 can be a single layer or a stack of one or more layers. Openings can be formed in material layer 210. In some embodiments, material layer 210 can be a pattern transfer layer, such as a hard mask. In some embodiments, material layer 210 can be a sacrificial layer. Material layer 210 can be an interlayer dielectric (e.g., a low-k dielectric with k-value lower than 3.9), silicon nitride, silicon oxide, silicon oxynitride, fluorine-doped silicate glass (FSG), or an undoped oxide UDOX). Material layer 210 can be a carbon-doped silicon oxide, a spin-on dielectric, a low-k dielectric and a silicon carbide with nitrogen doping, a low-k dielectric and silicon carbide with oxygen doping, a low-k dielectric with silicon nitride, or a low-k dielectric with silicon oxide. Material layer 210 can be fullerene-based spin-on-carbon (SoC) layer that exhibits improved etch characteristics compared to an oxide layer (e.g., increased etch rates or etch selectivity). In some embodiments, material layer 210 can be any combination of the aforementioned materials or any other suitable material in which openings can be formed with an etch process.

Prior to the formation of the photoresist layer 230, BARC layer 220 is spin coated over material layer 210. BARC layer 220 can suppress light reflections during a subsequent ultra violet (UV) or extreme ultra violet (EUV) light exposure of photoresist layer 230 and minimize undesirable generation of standing waves. Standing waves can increase the edge roughness of the resulting patterned photoresist structures. BARC material layer 210 also forms a flat surface, on which photoresist layer 230 can be formed, by operating as a filler that fills small imperfections of the top surface of material layer 210. In some embodiments, BARC layer 220 can be a silicon anti-reflective coating (SiARC).

In some embodiments, cumulatively, photoresist layer 230, BARC layer 220, and material layer 210 can be considered a photolithography tri-layer.

In operation 120 of method 100, photoresist layer 230 is patterned to form first features with a first CD and second features with a second CD that is larger than the first CD. According to some embodiments, the first and second CDs are designed to be nominally equal; however, due to pattern transfer errors and/or CD non-uniformity issues, the first CD can be smaller than the second CD, resulting in different CDs for the printed first and second features in photoresist layer 230. In some embodiments, the difference between the first CD and the second CD can range from about 1 nm to about 5 nm; for example, the difference can be about 2 nm. In some embodiments, the first and second features can have CDs between about 10 nm to about 20 nm.

Patterning of photoresist layer 230 can include multiple operations. A photoresist layer 230 is spin coated over BARC layer 220. Photoresist layer 230 is a compound that undergoes a change in solubility in a developer solution when exposed to UV or EUV light. A purpose of photoresist in semiconductor fabrication is to assist with the reticle pattern transfer to the wafer by protecting portions of the underlying material (e.g., material layer 210) during subsequent etch operations. Photoresist layer 230 can be, for example, an organic compound. In some embodiments, photoresist layer 230 can have a thickness between about 100 nm and about 200 nm. The aforementioned thickness range is merely an example and is not intended to be limiting. Photoresist layer 230 can be patterned according to a prescribed design layout so that the first and second features are formed.

For example, photoresist layer 230 can be patterned by exposing different areas of the photoresist to UV or EUV light according to the pattern on a reticle. A post exposure bake can initiate a chemical reaction in photoresist layer 230. The chemical reaction can change the solubility of the exposed areas of photoresist layer 230. For a negative-tone photoresist, exposed areas are crosslinked (hardened) and become non-soluble in a developer solution. For a positive-tone photoresist, the non-exposed areas are crosslinked (hardened) and become non-soluble in a developer solution. In other words, for a negative tone photoresist layer 230, the exposed areas are not removed. And for a positive-tone photoresist layer 230, the exposed areas are removed.

After the exposure operation, photoresist layer 230 is developed. During the develop operation, photoresist layer 230 is exposed to a developer solution that dissolves the non-crosslinked areas in photoresist layer 230 to form the first and second features. Depending on the photoresist type (e.g., negative-tone or positive-tone), non-soluble areas in photoresist layer 230 can be exposed or non-exposed areas. After the develop step, the substrate (e.g., substrate 200) is rinsed with de-ionized water (DI) and dried. A post-development thermal bake (also known as a "hard bake") is performed to evaporate any residual solvent and to harden the patterned photoresist layer 230. Nominal hard bake temperatures for positive-tone and negative-tone resists can be about 130° C. and 150° C., respectively.

Figure 3:
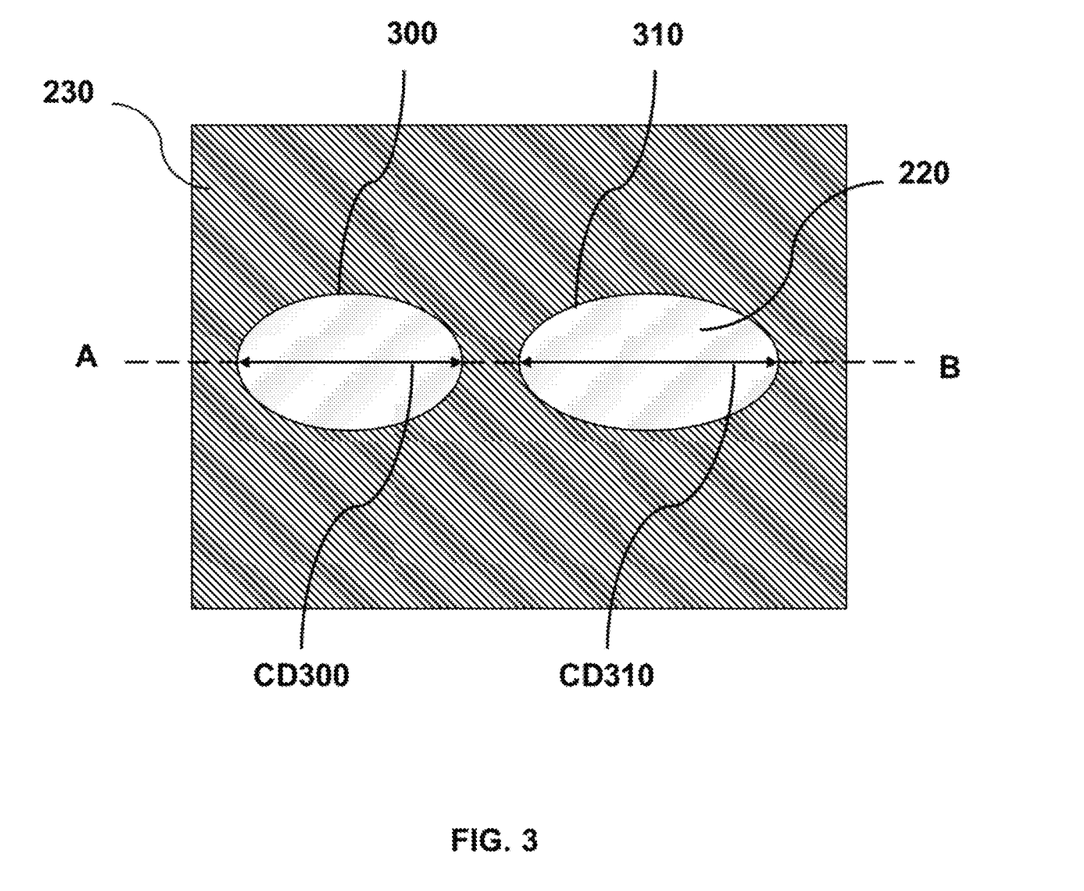
FIG. 3 is a top-view of elliptical contact openings in a photoresist layer, according to some embodiments.
Figure 4:
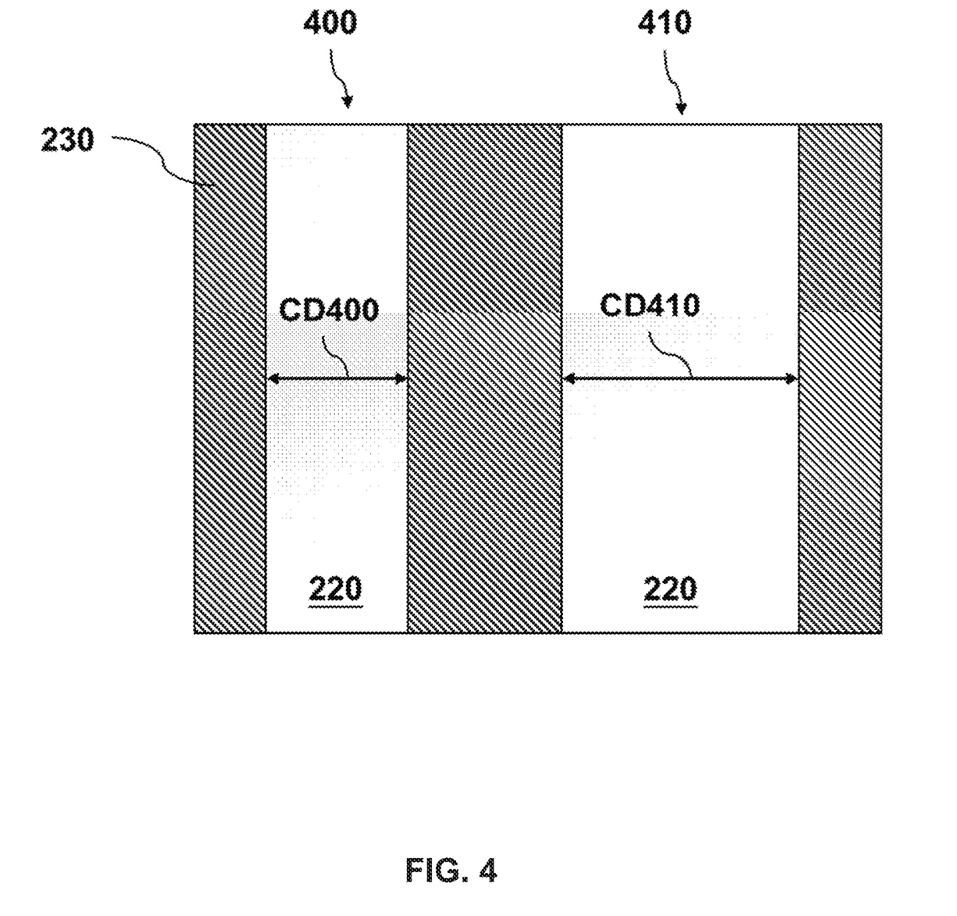
FIG. 4 is a top-view of trench contact openings in a photoresist layer, according to some embodiments.

FIGS. 3 and 4 are top views of FIG. 1 for different exemplary types of first and second features that can be formed after patterning of photoresist layer 230. For example, in FIG. 3, photoresist layer 230 can be patterned so that the resulting first and second features are elliptical contact openings 300 and 310 in photoresist layer 230. In some embodiments, elliptical contact openings 300 and 310 have different respective critical dimensions CD300 and CD310 due to CD non-uniformity. For example, CD310 can be about 3 nm larger than CD300. According to some embodiments, elliptical contact openings 300 and 310 expose the underlying BARC layer 220. According to some embodiments, the first and second features can be circular openings, trenches, lines or a combination thereof.

According to some embodiments, FIG. 4 is a top view of FIG. 1 where the patterned first and second features are trench openings 400 and 410 in photoresist layer 230. Trench openings 400 and 410 have widths described by CD400 and CD410. Trench opening 400 and 410 have different respective critical dimensions CD400 and CD410 due to CD non-uniformity and expose underlying BARC layer 220.

For example purposes, the first and second features will be described in the context of elliptical openings 300 and 310 of FIG. 3. Based on the disclosure herein, other shapes for the first and second features, as discussed above, can be used. These shapes are within the spirit and scope of this disclosure. Thereafter the terms first and second openings 300 and 310 and elliptical contact openings 300 and 310, respectively, may be used interchangeably.

Figure 5:
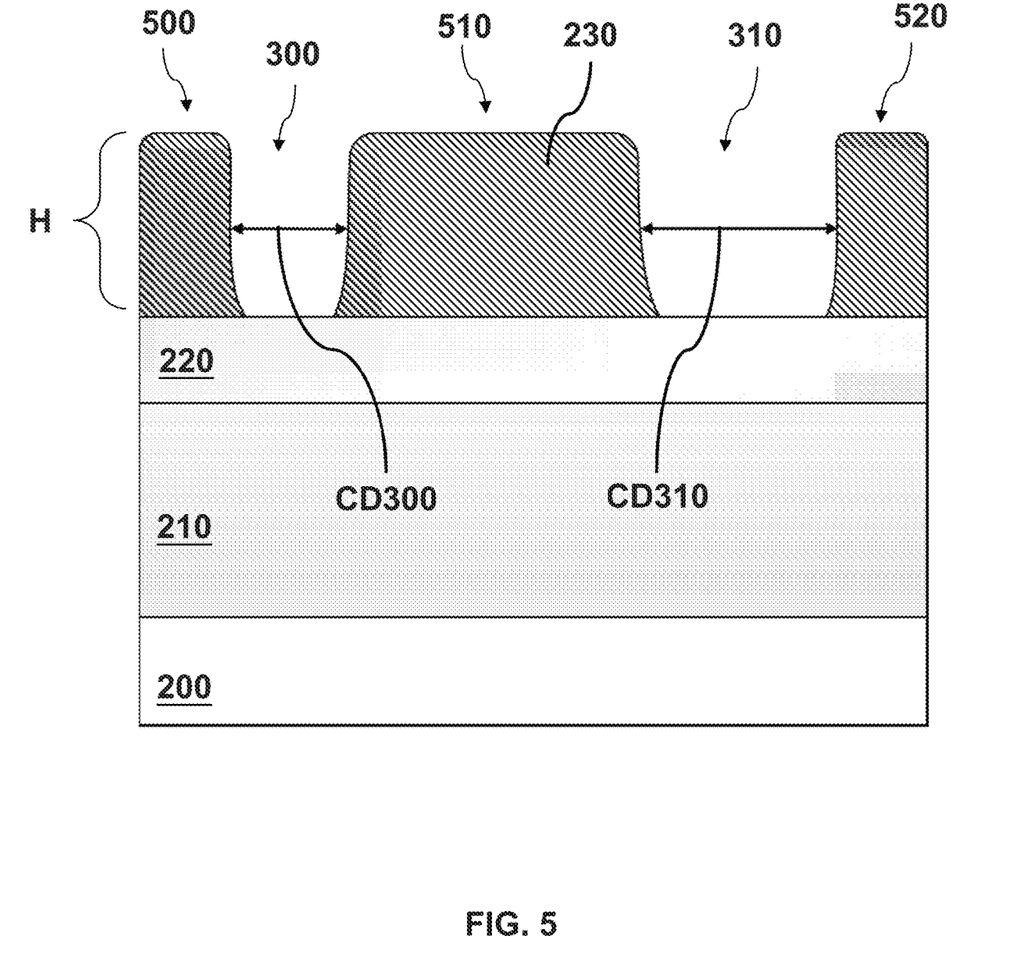
FIGS. 5-7 are cross-sectional views of features with different critical dimensions (CDs), according to some embodiments.

FIG. 5 is a cross-sectional view of FIG. 3 along line AB, according to some embodiments. In some embodiments, elliptical contact openings 300 and 310 have a height H, where height H ranges from about 0.5 nm to about 5 nm. As discussed above, CD300 can be smaller than CD310 due to CD non-uniformity. For example, CD300 can be about 14 nm and CD310 can be about 17 nm. In some embodiments, the patterned photoresist layer 230 forms patterned photoresist structures 500, 510, and 520, which form first feature 300 and second feature 310. According to some embodiments, more than one first and second features 300 and 310 can be formed after patterning photoresist layer 230.

In some embodiments, CD300 and CD310 can be considered respective spaces between patterned photoresist structures 500 and 510 and between 510 and 520. For example, CD300 can be considered a first space between patterned photoresist structures 500 and 510, and CD310 can be considered a second space between patterned photoresist structures 510 and 520.

After the develop step, a descum operation can be performed to remove residual photoresist from the exposed surface of BARC layer 220 inside first and second features 300 and 310. The descum operation is an etch process during which an oxygen plasma, a mixture of oxygen and tetrafluoromethane ($CF_4$) plasma, a nitrogen plasma, or carbon monoxide (CO) is employed to "burn" residual photoresist. Residual photoresist can interfere with the subsequent etch operations and result in non-etched contact openings in material layer 210. A side effect of the descum process is that it also removes photoresist material from patterned photoresist structures 500, 510, and 520. For example, in referring to FIG. 6, the descum process may reduce the height of first and second features 300 and 310 from H to H', and increase their CDs from CD300 and CD310 to CD300' and CD310', respectively. According to some embodiments, the CD change after the descum process may range from 0 nm to about 2 nm. In some embodiments, the descum process can provide more vertical sidewalls for first and second features 300 and 310, as shown in FIG. 6.

In operation 130 of method 100, a carbon layer is formed in second feature 310 so that the second CD (e.g., CD310') of second feature 310 is nominally equal to the first CD (e.g., CD300') of first feature 300. In some embodiments, this can be accomplished by performing one or more deposition/etch cycles. During the deposition/etch cycles, the carbon layer is deposited on the sidewall surfaces of first and second features 300 and 310 and over the patterned photoresist structures (e.g., 500, 510, and 520) and subsequently etched until CD310' is nominally equal to CD300'. After operation 130 the CD uniformity is improved since the CDs (e.g., CD300' and CD310') of first and second features (e.g., 300 and 310) are nominally equal.

In some embodiments, the carbon layer is an amorphous carbon film that includes chemical traces of hydrogen and fluorine. In some embodiments, the carbon layer is deposited using a plasma-enhanced CVD (PECVD) process. For example, a plasma can be generated at a frequency range between about 40 MHz to about 80 MHz using a reactant gas mixture of either $CHF_3$ and nitrogen ($N_2$), $CHF_3$ and hydrogen ($H_2$), $CF_4$ and $N_2$, or $CF_4$ and $H_2$. In some embodiments, the PECVD process pressure can range from about 60 mTorr to about 200 mTorr. The flow rate of $CHF_3$ or $CF_4$ gases can be about 80 sccm, and the flow rate of $N_2$ or $H_2$ can be about 50 sccm. During deposition, a negative bias voltage of about −150 Volts can be applied to substrate 200 through an electrostatic chuck. In some embodiments, the plasma power can be about 250 Watts. According to some embodiments, a 20 sec deposition can produce a carbon layer with a thickness from about 0.5 nm to about 5 nm.

Figure 6:
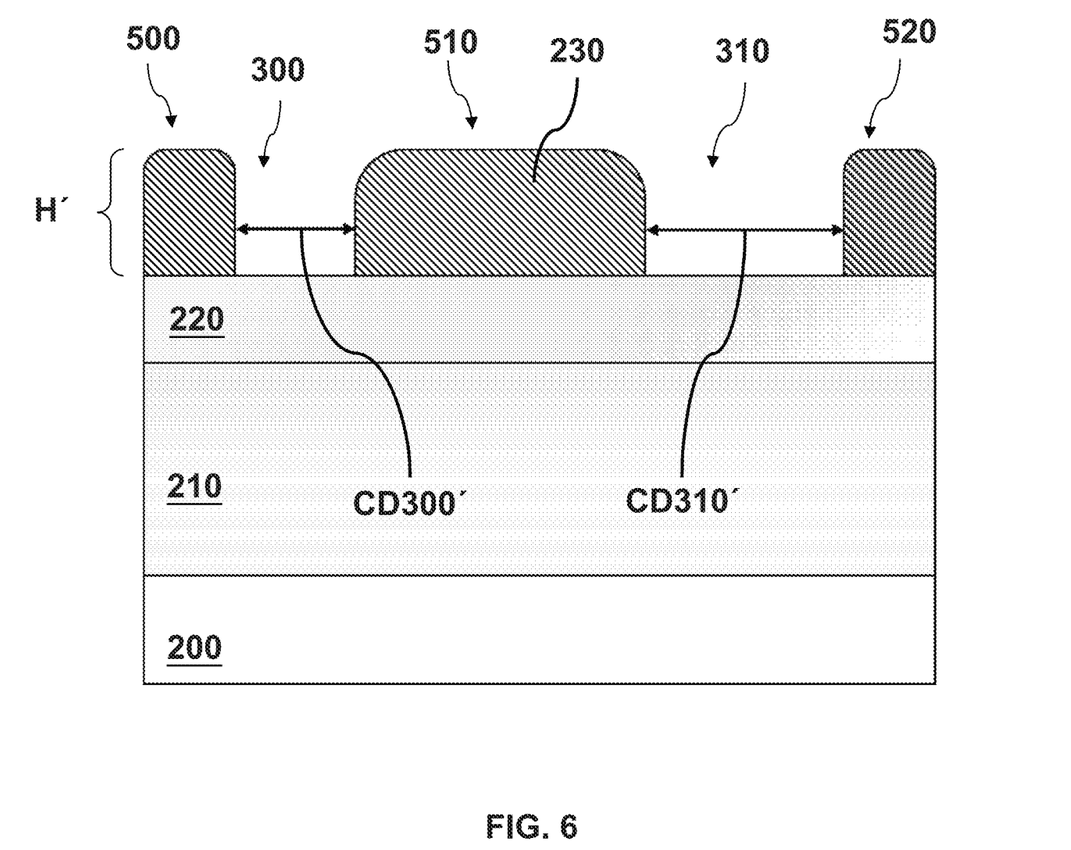
Figure 7:
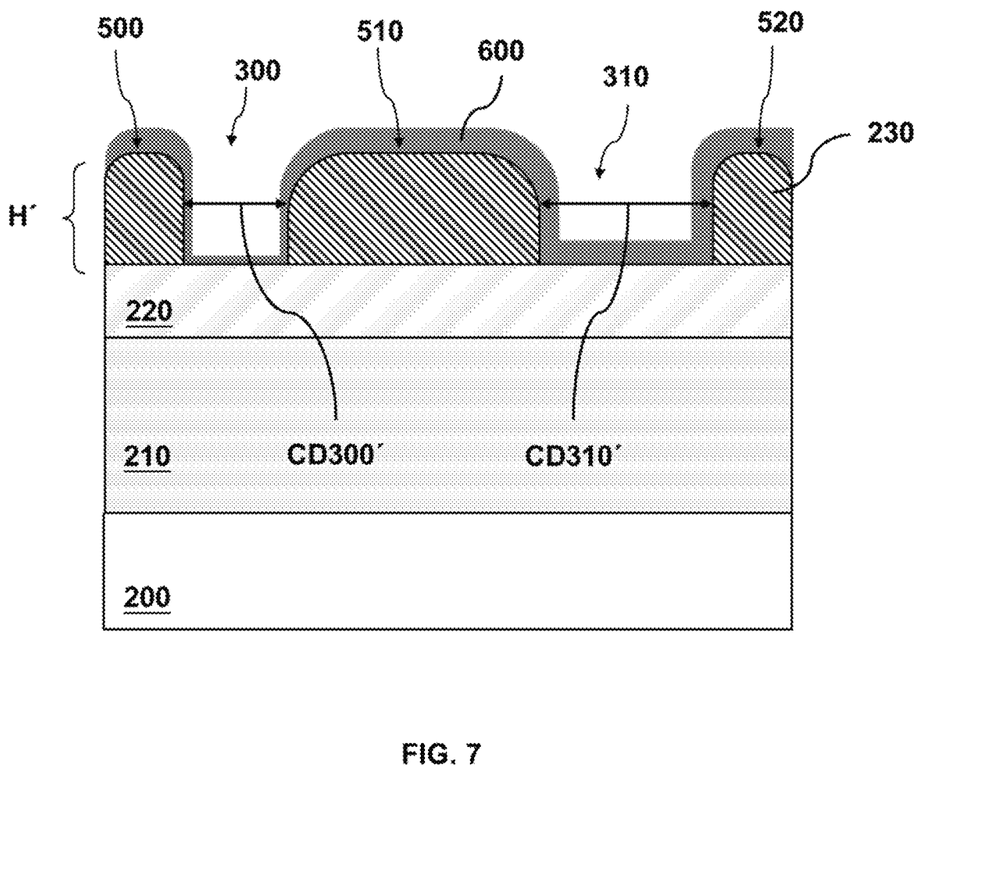

FIG. 7 shows FIG. 6 after the deposition of carbon layer 600, according to some embodiments. Due to size differences between first feature 300 and second feature 310, carbon layer 600 is deposited thicker in second feature 310 and thinner in first feature 300. This thickness difference relates to the bottom coverage of carbon layer 600 in first and second features 300 and 310, respectively (e.g., on BARC layer 220) and the sidewall coverage of carbon layer 600 on patterned photoresist structures 500, 510, and 520. This is because the reactant gases (e.g., $CHF_3$, $CF_4$, $H_2$, and $N_2$) diffuse slower in small features (e.g., first feature 300) and faster in large features (e.g., second feature 310). Consequently, the deposition rate of carbon layer 600 in first feature 300 is slower from the deposition rate in second feature 310. The thickness of carbon layer 600 on the fields (e.g., top surfaces) of patterned photoresist structures 500, 510, and 520 can be nominally equal. According to some embodiments, the deposition rate of carbon layer 600 in first feature 300 and in second feature 310 can be fine-tuned by adjusting PECVD process conditions, such as process pressure, plasma power, plasma frequency, etc.

Figure 8:
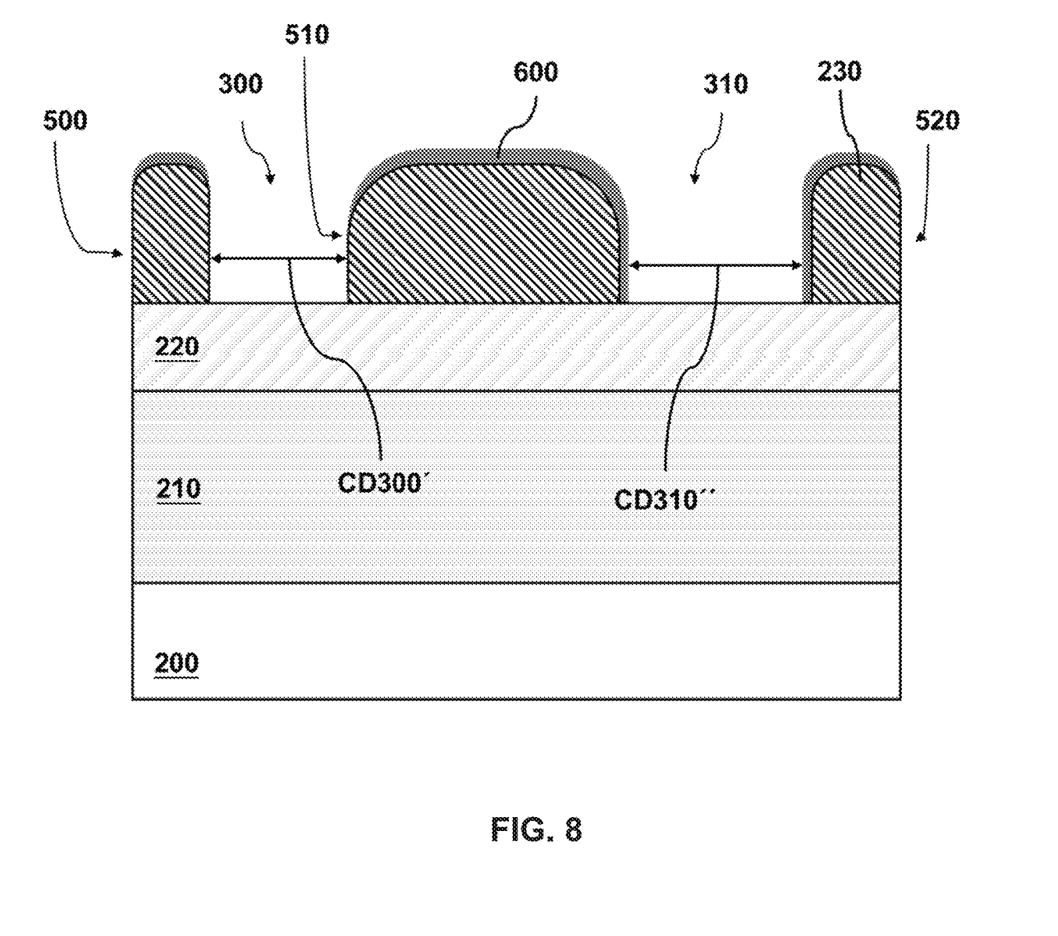
FIG. 8 is a cross-sectional view of features with nominally equal critical dimensions (CDs) after an etch operation, according to some embodiments.

In referring to FIG. 8, and according to some embodiments, a subsequent etch operation can remove with the same etching rate portions of the deposited carbon layer 600 from the first and second features. For example, due to a thickness difference of carbon layer 600 inside first and second features 300 and 310, the etch operation can remove carbon layer 600 from (i) the bottom of first and second features 300 and 310 (e.g., over BARC layer 220) and (ii) the sidewall surfaces of first feature 300 (e.g., sidewall surfaces of patterned photoresist structures 500 and 510). At the same time, carbon layer 600 is partially removed from the sidewall surfaces of second feature 310 (e.g., sidewall surfaces of patterned photoresist structures 510 and 520) because carbon layer 600 was thicker as-deposited in second feature 310. Since the etch process removes carbon layer 600 at the same etching rate from both features and due to the carbon layer's thickness difference between the first feature 300 and second feature 310, CD300' of first feature 300 remains unchanged and the CD of feature 310 is reduced from CD310' to CD310".

In some embodiments, the etch operation includes a low power (LP) and low frequency (LF) plasma process. For example, the plasma power can range from about 50 Watts to about 150 Watts, and the plasma frequency can range from about 5 MHz to about 40 MHz. Gases that can be used include an oxygen/nitrogen mixture with an oxygen to nitrogen ratio between about 2 and 5. A higher nitrogen content (e.g., oxygen to nitrogen ratio closer to 2) enhances a physical etch over a chemical etch. The higher nitrogen content can also enhance an anisotropic etch (e.g., high removal rate on horizontal surface and low removal rate on vertical surfaces, such as the sidewalls of patterned photoresist structures 500, 510, and 520). In some embodiments the duration of the etch is less than 10 sec.

In some embodiments, a single carbon layer deposition operation combined with a single etch operation can be a cycle in method 100. Additional cycles can be repeated until CD310" becomes nominally equal to CD310'. In some embodiments, an optimal number of cycles that can provide optimum CD uniformity per CD size can be determined. Additional cycles may degrade CD uniformity. By way of example and not limitation, for a CD300 of 14 nm and CD310 of 1.7 nm, 8 to 10 cycles of deposition and etch may achieve optimum CD uniformity. In some embodiments, the carbon layer deposition and etch operations are performed in-situ (e.g., without a vacuum break).

In some embodiments, instead of carbon layer 600, a dielectric layer can be deposited and subsequently etched. According to some embodiments, the dielectric layer can be silicon oxide ($SiO_2$) deposited with a high pressure CVD (HPCVD) process at a temperature range between about 240° C. and about 450° C., and a process pressure between about 10 Torr to about 30 Torr. Silane ($SiH_4$) and oxygen can be used as reactant gases for the $SiO_2$ deposition. Due to a poor step coverage and high deposition rate of the HPCVD process (e.g., non-conformal deposition at the bottom and the sidewall surfaces of a feature), the resulting $SiO_2$ layer can develop a large overhang over features with small CDs, such as first feature 300. As a result, thickness of the dielectric layer on the sidewall and bottom surfaces of first feature 300 can be limited compared to the thickness of the dielectric layer on the sidewall and bottom surfaces of second feature 310.

Figure 9:
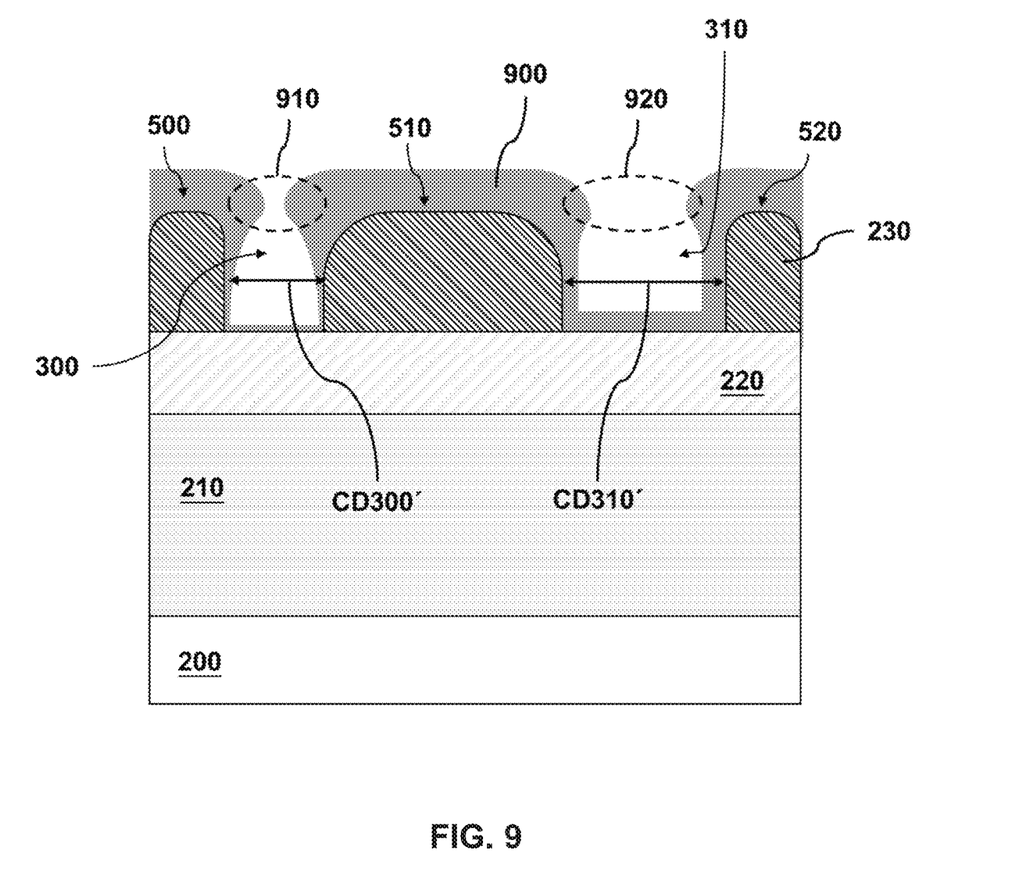
FIG. 9 is a cross-sectional view of features with different critical dimensions (CDs) due to CD non-uniformity after the deposition of a dielectric layer, according to some embodiments.

FIG. 9 shows FIG. 6 after the deposition of dielectric layer 900 using an HPCVD process, according to some embodiments. As discussed above, overhang 910 and overhang 920 are developed over first features 310 and 320 respectively. The build-up of overhang 910 over feature 300 prevents reactants from reaching the bottom and sidewall surfaces, and therefore, only limited amount of dielectric layer 900 can be deposited over these surfaces. In contrast, for second feature 310, where CD310' is larger than CD300', overhang 920 is not as pronounced, and a thicker dielectric layer 900 can be deposited over the bottom and sidewall surfaces of second features 310.

Figure 10:
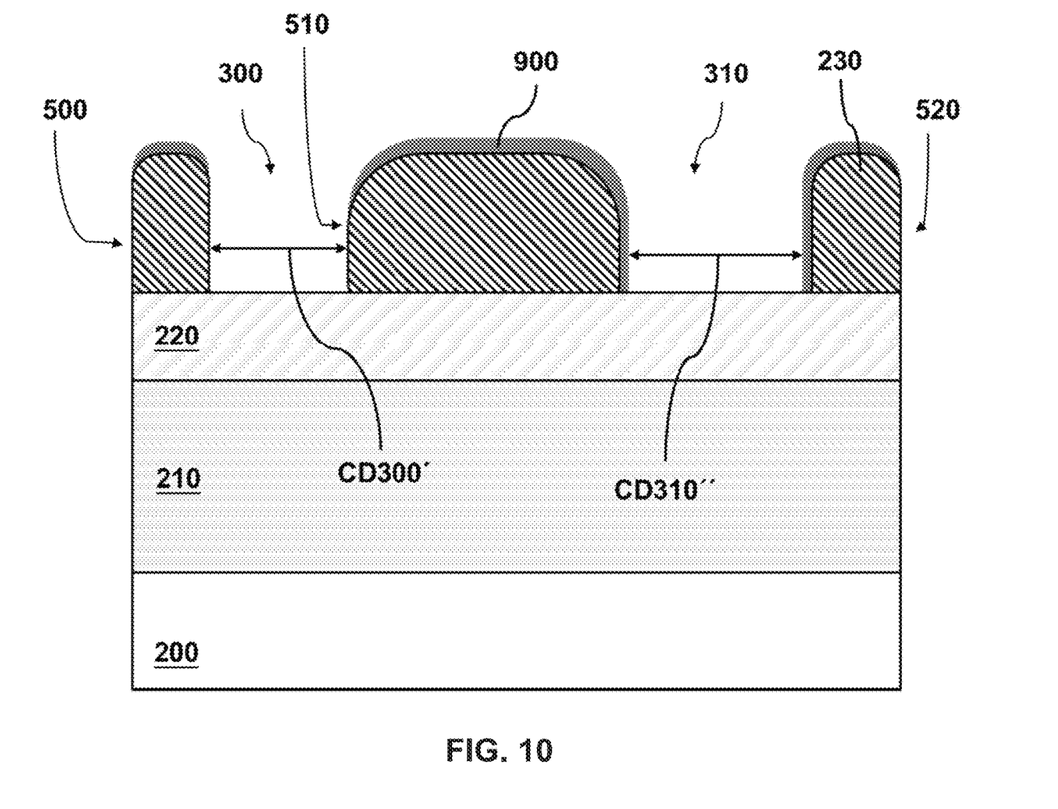
FIG. 10 is a cross-sectional view of features with nominally equal critical dimensions (CDs) after an argon sputter operation, according to some embodiments.

In some embodiments, an ex-situ etch process can be used to etch-back the overhang and remove portions of the deposited dielectric layer 900 at the same etching rates from first and second features 300 and 310 so that their resulting respective CDs are nominally equal. For example, FIG. 10 shows the resulting CDs (e.g., CD300' and CD310") of first and second features 300 and 310. In some embodiments, CD310" can be reduced so that it becomes nominally equal to CD300' after the etch process of dielectric layer 900. In some embodiments, the etch process is a physical etch process that uses argon plasma ions ($Ar^+$) via sputtering to remove dielectric layer 900. In some embodiments, the Ar sputter etch process can be from about 30 sec to about 40 sec. According to some embodiments, a single deposition of dielectric layer 900 can be followed by a single $Ar^+$ sputter etch operation.

Figure 11:
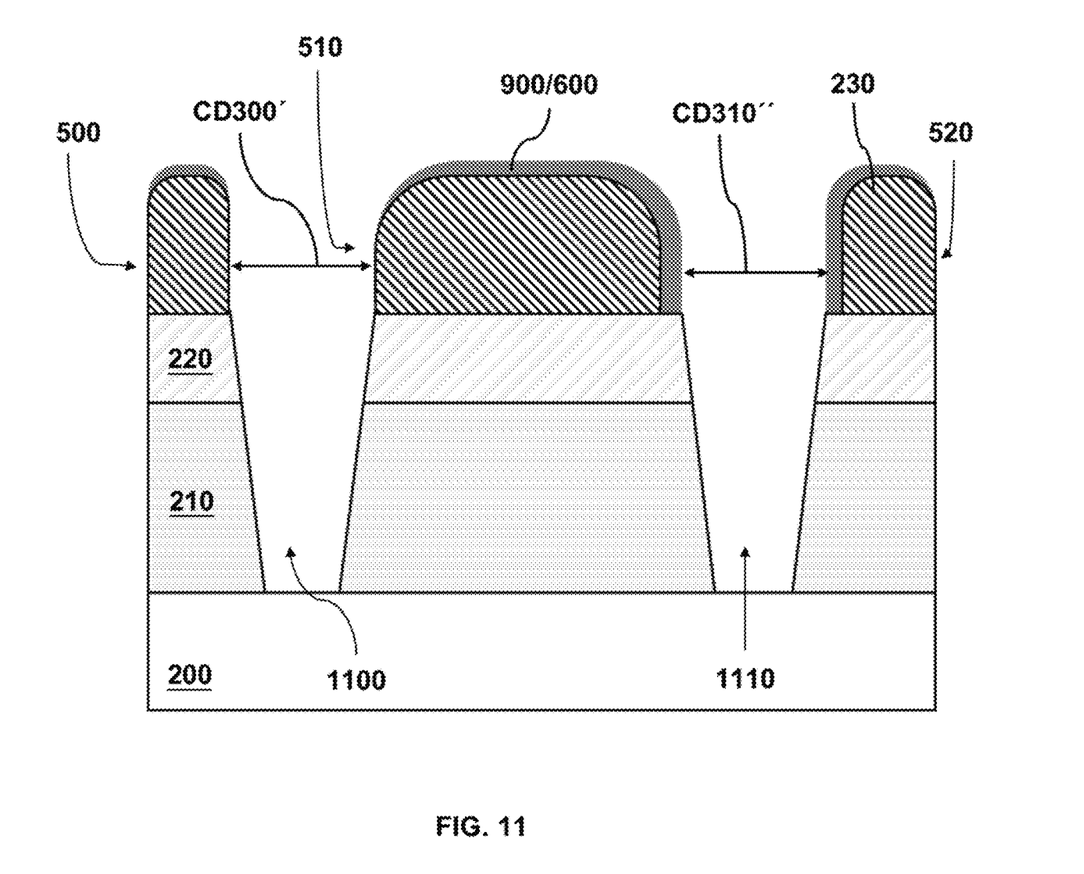
FIG. 11 is a cross-sectional view of contact openings with similar critical dimensions (CDs), according to some embodiments

In operation 140 of method 100, another etch process can be used to form contact openings 1100 and 1110 as shown in FIG. 11. Since CD300' and CD310' of first and second features are nominally equal after operation 130 of method 100, contact openings 1100 and 1110 are expected to have nominally equal top and bottom CDs. The etch process used to form contact openings 1100 and 1110 can be, for example, a reactive ion etch (RIE) process that etches through BARC layer 220 and material layer 210. In some embodiments, contact openings 1100 and 1110 are MOL contact openings or BEM, vias. In some embodiments, the RIE process can have different etch chemistries for BARC layer 220 and material layer 210. By way of example and not limitation, contact openings 1100 and 1110 can be in physical contact with substrate 200 or an intermediate layer between substrate 200 and material layer 210.

This disclosure is directed to improving post-photolithography CD uniformity for features printed on a photoresist. A layer (e.g., a carbon layer or a dielectric layer) can be formed on one or more printed features and subsequently etched to improve overall CD uniformity across the features. In some embodiments, the layer can be deposited using one or more deposition/etch cycles. For example, a 0.5 nm to 5 nm thick carbon layer can be deposited using a PECVD process with a $CHF_3$ and $N_2$ plasma, $CHF_3$ and $H_2$ plasma, $CF_4$ and $N_2$ plasma, or $CF_4$ and plasma. The PECVD deposition process can have a process pressure that ranges from about 60 mTorr to about 200 mTorr. The etch operation of the deposition/etch cycle can includes an LP and LF plasma process with a plasma power that can range from about 50 Watts to about 150 Watts and a plasma frequency that can range from about 5 MHz to about 40 MHz. Gases that can be used in the etch operation include an oxygen/nitrogen mixture with an oxygen to nitrogen ratio between about 2 and 5. In some embodiments, the CD uniformity of the printed features may be optimized after multiple deposition/etch cycles (e.g., after 3 cycles, after 5 cycles, after 8 cycles, after 10 cycles).

In some embodiments, a method includes a material layer disposed over a substrate and a photoresist over the material layer. The photoresist is patterned to form a first feature with a first critical dimension (CD) and a second feature with a second CD that is larger than the first CD. Further, a carbon layer is formed with one or more deposition/etch cycles in the second feature to form a modified second CD that is nominally equal to the first CD, where the one or more deposition/etch cycles include a first carbon layer deposited in the first feature and a second carbon layer deposited in the second feature, where the second carbon layer is thicker than the first carbon layer. Additionally, the first carbon layer is etched in the first feature and the second carbon layer is etched in the second feature.

In some embodiments, a method includes a material layer disposed over a substrate and a photoresist disposed over the material layer. The photoresist is patterned to form a first feature with a first critical dimension (CD) and a second feature with a second CD that is larger than the first CD. A dielectric layer is formed in the second feature to form a modified second CD that is nominally equal to the first CD, where forming the dielectric layer includes a first dielectric layer deposited in the first feature and a second dielectric layer deposited in the second feature, where the second dielectric layer is thicker than the first dielectric layer. The first dielectric layer is etched in the first feature and the second dielectric layer is etched in the second feature until the second CD is nominally equal to the first CD.

In some embodiments, a method includes a photoresist disposed over a material layer. The photoresist is patterned to form first photoresist structures spaced apart from one another by a first space and second photoresist structures spaced apart from one another by a second space larger than the first space. Further, a layer is formed with one or more deposition/etch cycles in the second space to form a modified second space with a critical dimension (CD) that is nominally equal to a CD of the first space, where the one or more deposition/etch cycles include a first layer deposited in the first space and a second layer deposited in the second space, where the second layer is thicker than the first layer. Further, the first layer is etched in the first space and the second layer is etched in the second space at the same etching rate.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a photoresist layer on a substrate;
   etching first and second openings in the photoresist layer, wherein the first opening is larger than the second opening;
   depositing a carbon layer in the first and second openings to form a first carbon layer on sidewalls of the first opening and a second carbon layer on sidewalls of the second opening, wherein the first carbon layer is thicker than the second carbon layer;
   etching the carbon layer to remove the second carbon layer from the sidewalls of the second opening and to reduce a thickness of the first carbon layer on the sidewalk of the first opening so that a width of the first opening is substantially equal to a width of the second opening; and
   etching the substrate through the first and second openings to form contact openings with substantially equal widths.

2. The method of claim 1, wherein the substrate comprises a partially fabricated semiconductor wafer with an antireflective coating disposed thereon.

3. The method of claim 1, wherein etching the first and second openings in the photoresist layer comprises forming the first opening about 3 nm larger than the second opening.

4. The method of claim 1, wherein depositing the carbon layer comprises depositing the carbon layer using a fluorocarbon gas precursor in a plasma-enhanced deposition process.

5. The method of claim 1, wherein depositing the carbon layer comprises depositing the first carbon layer on a first surface of the substrate exposed by the first opening and the second carbon layer on a second surface of the substrate exposed by the second opening.

6. The method of claim 5, wherein the first and second surfaces are top surfaces of the substrate.

7. The method of claim 5, wherein etching the carbon layer comprises removing the first carbon layer from the first surface and removing the second carbon layer from the second surface.

8. A method, comprising:
   forming a photoresist layer on a substrate;
   forming first and second openings in the photoresist layer, wherein the first opening is wider than the second opening;
   depositing a dielectric layer in the first and second openings to form a first dielectric layer on sidewalls of the first opening and a second dielectric layer on sidewalls of the second opening, wherein the first dielectric layer is thicker than the second dielectric layer;
   etching the dielectric layer to remove the second dielectric layer from the sidewalls of the second opening and to reduce a thickness of the first dielectric layer on the sidewalls of the first opening so that a width of the first opening is substantially equal to a width of the second opening; and
   etching the substrate through the first and second openings to form contact openings.

9. The method of claim 8, wherein depositing the dielectric layer comprises depositing silicon oxide with a non-conformal deposition process using silane and oxygen.

10. The method of claim 8, wherein etching the dielectric layer comprises etching the dielectric layer with a physical etching process using argon ions.

11. The method of claim 8, wherein forming the first and second openings in the photoresist layer comprises forming the first opening with a width that is about 3 nm larger than a width of the second opening.

12. The method of claim 8, forming the first and second openings in the photoresist layer comprises forming the first and second openings with substantially vertical sidewalls.

13. The method of claim 8, wherein forming the first and second openings in the photoresist layer comprises increasing widths of the first and second openings using a descum process.

14. The method of claim 8, wherein etching the substrate comprises forming top widths of the contact openings that are substantially equal to the widths of the first and second openings.

15. A method, comprising:
  forming a photoresist layer on a substrate;
  etching the photoresist layer to form a first opening and a second opening, wherein the first opening is wider than the second opening;
  forming first spacers on sidewalk of the first opening and second spacers on sidewalls of the second opening, wherein the first spacers are thicker than the second spacers;
  removing the second spacers from the second opening and reducing a thickness of the first spacers in the first opening so that a width of the first opening is substantially equal to a width of the second opening; and
  etching the substrate through the first and second openings to form contact openings with substantially equal top widths.

16. The method of claim 15, wherein forming the first and second spacers comprises depositing silicon oxide with a non-conformal deposition process.

17. The method of claim 15, wherein forming the first and second spacers comprises depositing a carbon layer with a plasma-enhanced deposition process using a fluorocarbon gas.

18. The method of claim 15, wherein removing the second spacers and reducing the thickness of the first spacers comprises etching the first and second spacers with an anisotropic etching process.

19. The method of claim 15, wherein forming the first and second spacers comprises depositing a material layer in the first and second openings to form the first and second spacers.

20. The method of claim 15, wherein forming the first and second spacers comprises depositing a material layer on horizontal surfaces of the photoresist layer.

* * * * *